United States Patent [19]
Tran

[11] Patent Number: 5,043,671

[45] Date of Patent: Aug. 27, 1991

[54] DEVICE FOR ADDITION OF THE POWER FROM TWO ALTERNATING SIGNALS IN A LINEAR ACCELERATOR

[75] Inventor: Duc Tien Tran, Remy les Chevreuses, France

[73] Assignee: CGR MeV, Buc, France

[21] Appl. No.: 449,943

[22] PCT Filed: May 24, 1988

[86] PCT No.: PCT/FR88/00259

§ 371 Date: Nov. 27, 1989

§ 102(e) Date: Nov. 27, 1989

[87] PCT Pub. No.: WO88/09567

PCT Pub. Date: Dec. 1, 1988

[30] Foreign Application Priority Data

May 26, 1987 [FR] France .............................. 87 07416

[51] Int. Cl.[5] ......................... H03K 5/22; G05F 1/70; H02J 3/08

[52] U.S. Cl. .................................... 328/233; 328/155; 323/212; 333/140; 332/134

[58] Field of Search ................ 328/155, 233; 323/212, 323/213, 214, 215; 333/138, 139, 140; 332/103, 131, 134, 147

[56] References Cited

U.S. PATENT DOCUMENTS

| | | | |
|---|---|---|---|
| 2,768,356 | 10/1956 | van de Lindt | 333/33 |
| 3,013,224 | 12/1961 | King | 333/18 |
| 3,517,317 | 6/1970 | Sire | 358/156 |

FOREIGN PATENT DOCUMENTS

| | | |
|---|---|---|
| 0232190 | 8/1987 | European Pat. Off. . |
| 1942279 | 2/1970 | Fed. Rep. of Germany . |
| 2100526 | 12/1982 | United Kingdom . |

*Primary Examiner*—Donald J. Yusko
*Assistant Examiner*—Brian Zimmerman
*Attorney, Agent, or Firm*—Oblon, Spivak, McClelland, Maier & Neustadt

[57] ABSTRACT

An improvement in a device for the combination of two alternating signals of the same frequency in which two microwave combination devices are associated with two phase shifters to combine the two signals. By coupling the two phase shifters according to a particular coupling relationship, the two alternating signals are combined regardless of the load presented at one of the these two signals.

10 Claims, 3 Drawing Sheets

DEVICE FOR ADDITION OF THE POWER FROM TWO ALTERNATING SIGNALS IN A LINEAR ACCELERATOR

BACKGROUND OF THE INVENTION

1. Field of the Invention

An object of the present invention is an improved device for the combination of two alternating signals of the same frequency. More particularly, an object of the invention is the addition of two signals of different phase and amplitude. In a special application, the invention has microwave-related uses.

In one example, the cavity resonators of a linear accelerator are supplied with a microwave signal. The electron beam produced by the cathode of this accelerator picks up the microwave energy from the cavities, becomes organized and strikes an anode target with an energy depending essentially on the energy of the picked up microwave signal. The efficiency of this picking up process is not total. In the application referred to, the microwave signal which is not absorbed by the electron beam can then be recovered and reinjected, and gets added to the supply signal. With the device of the invention, this addition is improved.

2. Description of the Prior Art

There is a known device, according to the French patent No. 86 00323, filed on behalf of the same Applicant on 10th Jan. 1986, for combining alternating signals of the same frequency wherein the problem of differences in amplitudes of signals to be added has been resolved. When a high frequency power signal is injected into a cavity resonator, the output impedance of the generator is matched with the input impedance of the cavity in such a way that there is no reflection of power. The high-frequency powers is then used to the maximum. If a beam of particles is injected into this cavity, this beam absorbs power and destroys the matching. To retrieve the situation, the cavity must be re-adapted to the source by changing the coupling coefficient. By acting in this way, the beam load is compensated for. Now, if we consider, more particularly, sections of travelling-wave linear accelerators, the power is propagated along the section, creating therein electromagnetic fields which are used to accelerate the charged particles. A portion of the power is lost in the section, in the form of losses by Joule effect in the metallic walls and in the form of energy discharged by the beam of particles. At the end of the section, there remains a part of the power which must be dissipated in an adapted load if it is sought to avoid reflecting it at the input where it would disturb the high-frequency source. In the previous patent application, it was known to reinject this part of the power in taking into account a beam load stabilized at a given value.

An improvement of the system thus consists in reusing An improvement of the this power, which is otherwise unnecessarily lost, by re-introducing it at the input of the accelerator by a system of re-circulation. A re-circulation system of this type consists essentially of a phase shifter and a coupler. For a given beam, the coupling coefficient of the coupler can be computed so that signals coming, firstly, from the source and, secondly, from the output of the accelerator, are totally confined to the load, provided that the phase shifter is appropriately set. Then, all the power coming from the source is completely used in the accelerator, apart from loss in the re-circulation circuits and in the coupler. This balance is unfortunately broken for another current value, and cannot be re-established regardless of the setting of the phase shifter. This disadvantage can be avoided by using a compensation system, especially the system described in the above-mentioned patent application. In this system, for each attenuation rate of the accelerator, namely for each value of the particle beam current, it is possible to set two phase shifters so as to cancel the signal coming out of a combination element. In this way, all the power coming from a source is completely re-used in the accelerator, with the exception of power lost in the re-circulation circuit. While this approach has been verified, it is difficult to adjust because it is difficult to automate the setting of the phase shifters. Consequently, the beam load varies, the reinjection is immediately disturbed and the efficiency of the accelerator drops considerably.

An object of the present invention is to remove these drawbacks by noting that the setting of each phase shifter is not independent but that, on the contrary, these settings are related to the function to be fulfilled. Thus, in the invention, the two phase shifters are coupled to each other according to a coupling relationship that depends on the mode of combination of the signals which it is sought to obtain; subsequently only one of the phase shifters is set, the second one following automatically according to the coupling mode, so that the matching is made automatic.

SUMMARY OF THE INVENTION

Hence, an object of the invention is an improved device for the combination of two alternating signals of the same frequency, successively comprising:

a first phase shifter which can be set to shift the phase of the first of these signals with respect to that of the second signal;

a first combination means provided with two inputs, to receive the first two signals, and two outputs to give a third and fourth signal, a second phase shifter which can be set to shift the phase of the third signal with respect to that of the fourth signal, and a second combination means provided with two inputs to receive the third and fourth signal, and two outputs to deliver a fifth signal and a sixth signal, this fifth signal and sixth signal being combinations of two first signals according to a mode which depends on the settings of the two adjustable phase shifters, said device comprising, means to couple the two phase shifters.

BRIEF DESCRIPTION OF THE DRAWINGS

The description invention will be better understood from the following invention and from an examination of the appended figures which are given by way of indication and in no way restrict the scope of the invention. Of these figures.

DESCRIPTION OF PREFERRED EMBODIMENTS

Figure 1:
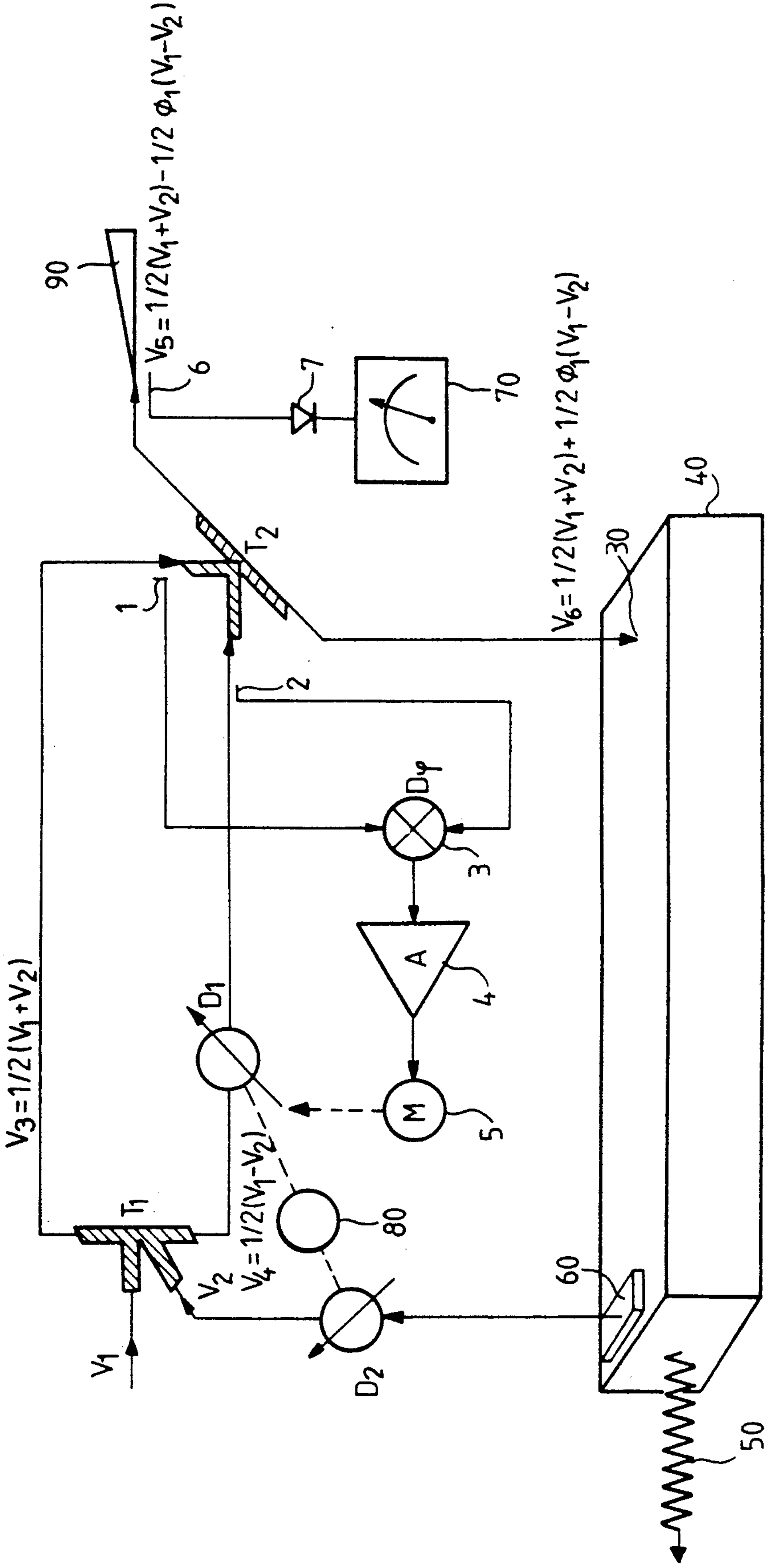
FIG. 1 shows an example of a use of an improved device according to the invention.

FIG. 1 shows a combination device, according to the invention, for a microwave application. It has a first phase shifter $D_2$ to phase shift a first signal $V_1$ with respect to a second signal $V_2$. Once the phase shift is imposed, these two signals are introduced by two inputs of a first combination means: in this case a magic T-junction (also called a hybrid T-junction) $T_1$. These two signals are introduced at the orthogonal inputs of this T-junction. They leave through the opposite outputs of this T-junction. The signals, $V_3$ and $V_4$, available at the opposite outputs, are subjected to a phase shift. One of these signals, $V_4$ is introduced into a second phase shifter $D_1$. They then drive two inputs of a second combination means $T_2$. The means $T_2$ is, here, also a magic T-junction. The third and fourth signals coming from the T-junction $T_1$, which are phase shifted by the second phase shifter $D_1$, emerge combined from the T-junction $T_2$ as a fifth signal $V_5$ and a sixth signal $V_6$. In the special application considered, one of these available signals $V_6$ corresponds to the sum of the signals available at the inputs of the T-junction $T_1$. The other signal $V_5$ is nil. The signal $V_6$ can be introduced into an input 30 of a linear accelerator 40. This linear accelerator emits, for example, an X-radiation 50. This linear accelerator has recovery means 60 to recover that part of the microwave signal, introduced in 30, which is not absorbed to produce the radiation 50. The signal available at the output 60 is introduced at the input of the first phase shifter $D_2$. When the device is properly set, an indicator 70 connected to the signal $V_5$ indicates 0. Consequently, the power coming from the inputs of the T-junction $T_1$ is all applied to the accelerator 40.

The essential aspect of the invention is the presence of a coupling element 80 between the phase shift imposed by the phase shifter $D_2$ and the phase shift imposed by the phase shifting device $D_1$, respectively between the first and second signal, on the one hand, and between the third and fourth signal, on the other hand. This coupler 80 couples the phase shifting devices according to a coupling relationship which depends on the combination mode sought. In the example presented, the combination mode is an addition, in power, of the two signals $V_1$ and $V_2$. The following description relates more particularly to this case although other modes of combinations can be considered where the particular coupling relationships are also noteworthy.

For a clearer understanding of the proposed devices, we shall establish the relationships between the various parameters which have not been brought out in the above-mentioned patent application. Let $\phi_1$ be the rotation matrix of an angle $\phi_1$ due to the second phase shifter $D_1$. Similarly, $\phi_2$ is the rotation matrix of an angle $\phi_2$ due to the first shifter $D_2$. Furthermore $\phi$ designates the attenuation coefficient of the microwave signal of the accelerator 40 due to loss by Joule effect and to the power conveyed by the beam of particles. Knowing that a magic T-junction is used to obtain the sum of and the difference between signals, it is easy to establish the value of the signals $V_5$ and $V_6$ which respectively go in a load 90 and in the accelerator 40. The respective values are shown in FIG. 1. The goal to be achieved is that $V_5$ should be zero. Since the phase shifter does not modify the amplitude of $(V_1-V_2)$, the condition $V_5$ becomes:

$$|V_1+V_2|=|V_1-V_2|$$

Figure 2:
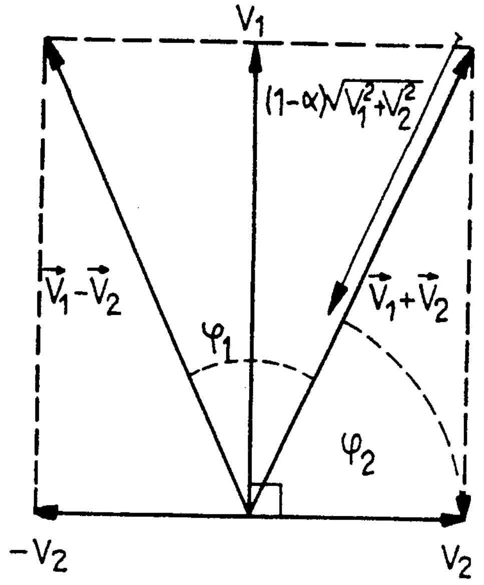
FIG. 2 is a vector diagram showing the coupling relationship of the two phase shifters.

This means that $V_1$ and $V_2$ should be in phase quadrature. The expressions of $V_5$ and $V_6$ enable the defining of $\phi_1$ and $\phi_2$ as a function of $\phi$. The vector diagram of FIG. 2 shows $V_1$ in quadrature with $V_2$ as well as the geometrical compositions $V_1+V_2$ and $V_1-V_2$. This diagram also has the angles $\phi_1$ and $\phi_2$. It thus appears, obviously, in the case where addition is sought for the combination that, firstly $\phi_1$ and $\phi_2$ are linked by the following relationship:

$$\tfrac{1}{2}(\phi)+\phi_2=\pi/2+2k\pi$$

and that, furthermore, the value of $\phi_1$ is given by $$tg(\phi_1/2)=\alpha/\sqrt{1-\alpha^2}$$

The aim therefore, as announced earlier, is that $\phi_1$ should be able to vary with $\alpha$, i.e. with the beam load. For a given beam load (for example with no beam), an initial setting should be such that the two preceding relationships are met. For another value of the beam current, the variations of $\phi_1$ and $\phi_2$ should follow a differential relationship:

$$\tfrac{1}{2}(d\phi)+d\phi_2=0$$

The devices according to the present invention fulfil the conditions thus indicated. They are based on phase shifters which are coupled and controlled either mechanically or electrically.

Figure 3:
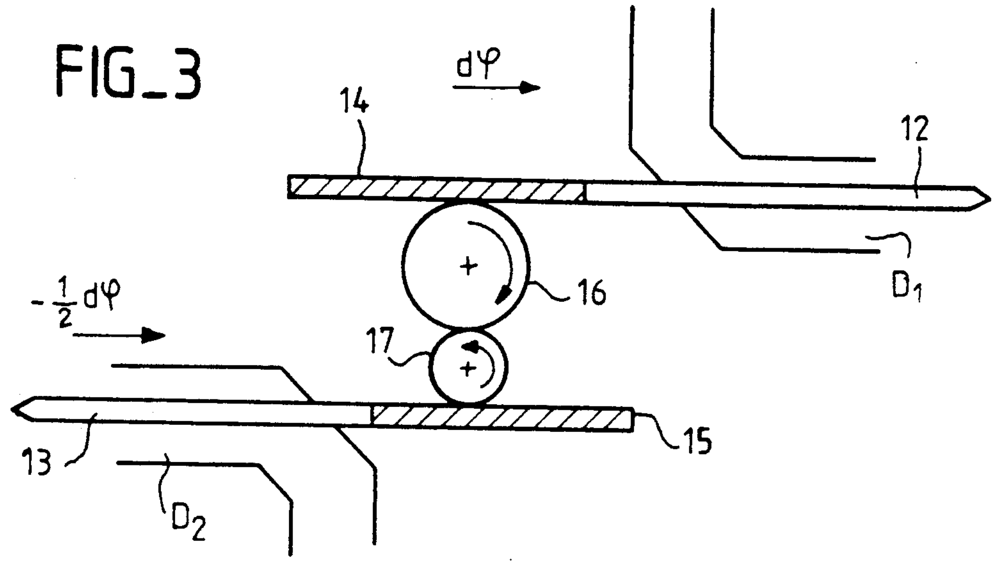
FIGS. 3 and 4 show two embodiments of means for the mechanical coupling of the two devices.

For a better understanding of the working of these devices, reference can be made to FIG. 3 which shows an embodiment of these devices. Signals proportionate to r the input signals of the second magic T-junction $T_2$ are picked up by the couplers 1 and 2 and compared in phase by a phase discriminator 3. The output signal of the discriminator 3, applied beforehand to an amplifier 4, controls a motor 5 which actuates one of the phase shifters, for example the second phase shifter $D_1$. The first phase shifter $D_2$ is actuated according to the motion of the second phase shifter $D_1$ by a mechanical coupler 80 which achieves the coupling relationship indicated above. For the initial setting of the phases of the phase shifters, the signal picked up at the input of the load 90 by a coupler 6 is used. This signal, detected by a diode 7, is displayed on the multimeter 70. The initial setting can be done with any given beam current, but advantageously with a zero beam current. This setting enables the fixing of the initial positions of the phase shifters $D_1$ and $D_2$ with respect to each another. These positions are obtained when the multimeter 70 indicates a zero signal. The multimeter 70 can remain fixed for permanent monitoring or for use only during the initial setting. It is also possible to use the signal available at the output of the diode 7 to control the motor 5 instead of the phase discriminator 3. However, this method, which would be quite feasible, gives less sensitivity because it acts like an amplitude discriminator and not like a phase discriminator.

Figure 4:
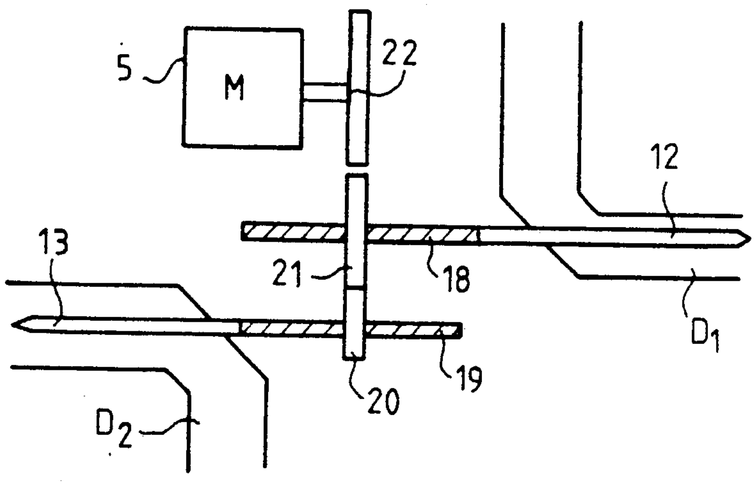

FIG. 3 shows a possible embodiment of the coupler 80. The phase shifters $D_1$ and $D_2$ are phase shifters with sliding dielectric rods 12 and 13. These rods have extensions 14 and 15 which are, for example, toothed rods. These toothed rods are actuated by the electrical motor 5, by means of two transmission gear wheels 16 and 17 with a gear ratio of 2 (when the two dielectrical rods are identical) so that a forward motion d in the phase shifter $D_1$ causes a backward motion d /2 in the phase shifter $D_2$. It is possible to conceive of other mechanical couplers fulfilling the same function, for example the coupler of FIG. 4 where the sliding dielectric rods are actuated by worm screws 18, 19 through toothed wheels 20, 21 and 22 (the toothed wheel 22 being driven by the motor 5). The ratio between the radii of the wheels 20 and 21 will be 2 if the dielectric rods are identical, in the adding application referred to.

Figure 5:
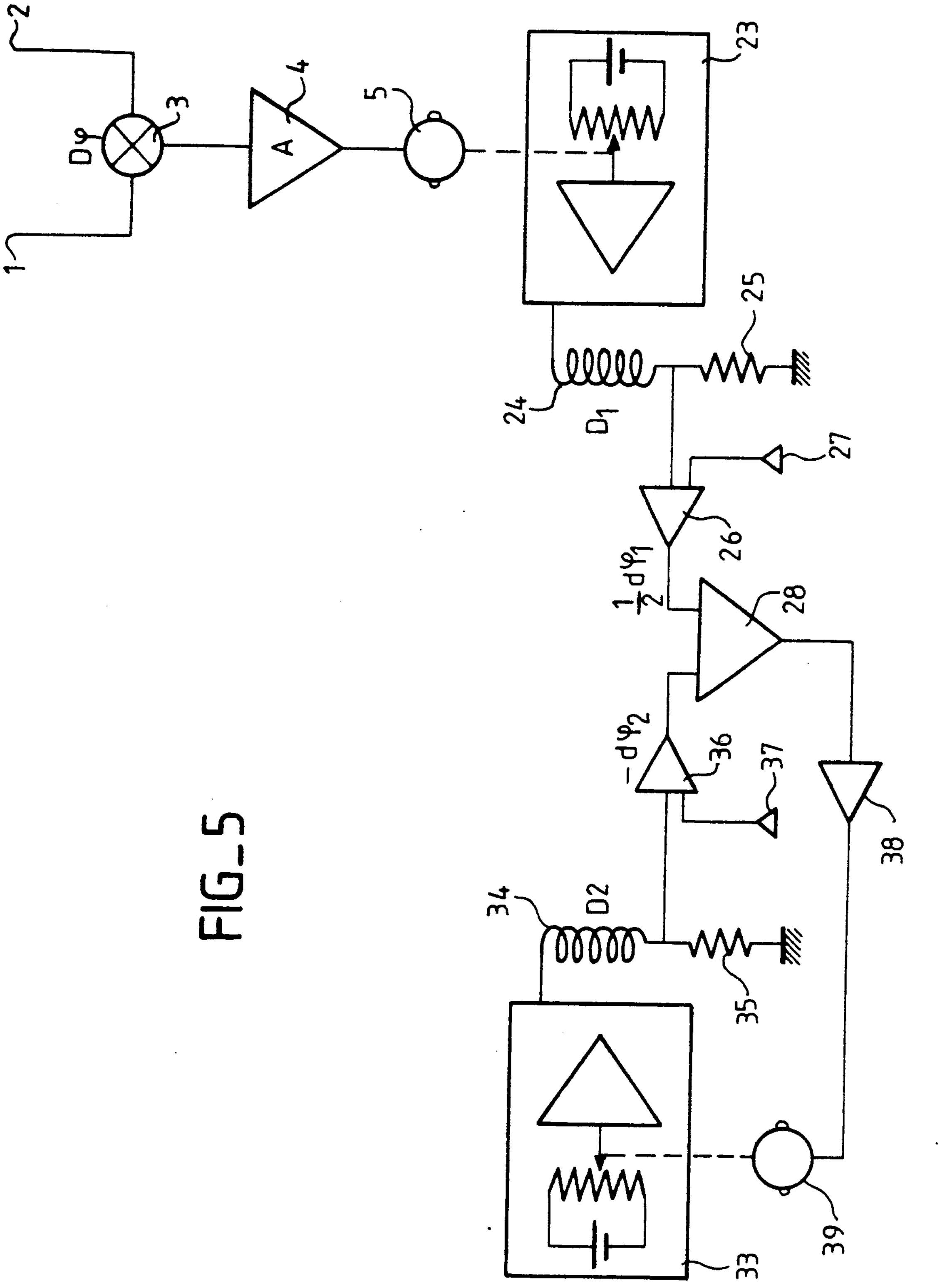
FIG. 5 is an embodiment of an electronic coupling of the two phase shifters.

It is of course possible to design electrically controlled phase shifters. For example, phase shifters of this type would consist of circuits magnetized by an electromagnet. FIG. 5 shows an embodiment of phase shifters of this type. The system shown is none other than the electro-mechanical device of the previous examples translated into an electrical circuit. The system is identical to the previous ones including the motor 5. This motor 5 controls the output rate of a direct current supply 23. The phase shifter $D_1$ is connected to this supply 23 and has a winding 24 which produces a magnetic field that drives its phase shift, in series with a resistor 25. The phase shift introduced by the phase shifter appears in the form of the voltage available at the terminals of the resistor 25. The voltage available at the terminals of 25 is amplified by an amplitude comparator 26, with an adjustable set-value threshold 27. The first phase shifter $D_2$ also has a coil 34 which is powered by a direct current supply 33 and is series-connected with a resistor 35. The signal picked up at the terminals of the resistor 35 is also transmitted to a comparator 36 where it is compared to a set-value magnitude 37 which can also be adjusted. The output of the comparator 36 is introduced into an amplitude discriminator 28. The access to the amplitude discriminator 28 is modulated by weighting coefficients, $\frac{1}{2}$ and $-1$ respectively. The signal available at the output of the discriminator 28 is therefore proportionate to $(d\phi_1)/2+d\phi_2$. It is used to control the output rate of the supply 33 by means of a motor 39.

I claim:

1. A linear accelerator comprising an improved device for the power addition of two alternating signals of the same frequency, said two signals corresponding respectively to a power supply signal for the accelerator and a recuperation signal from said accelerator, said recuperation signal corresponding to a non-absorbed energy in said accelerator, said accelerator successively comprising, in order to combine said signals:

a first phase shifter which can be set to shift the phase of the first of these signals with respect to that of the second signal;

a first combination means provided with two inputs, to receive the first two signals, and two outputs to give a third and fourth signal, a second phase shifter which can be set to shift the phase of the third signal with respect to that of the fourth signal, and a second combination means provided with two inputs to receive the third and fourth signal, and two outputs to deliver a fifth signal and a sixth signal, this fifth signal and sixth signal being combinations of said two first signals according to an addition mode which depends on the settings of the two adjustable phase shifters, said sixth signal being injected in said accelerator, said accelerator further comprising, means to couple the two phase shifters.

2. An accelerator according to claim 1 wherein one of the output signals of the second means represents the sum of the first two signals and the other output signal being zero, and wherein the coupling means comprise means so that the sum of the phase shift ($\phi_2$), imposed by the first phase shifter, and half the phase shift ($\phi_1$), imposed by the second phase shifter, is equal to $\pi/2$ modulo $2k\pi$, wherein k is an integer.

3. An accelerator according to claim 1 or 2 wherein the coupling means comprise a phase discriminating device to measure the relative phase between the third signal and the fourth signal, before or after the action of the second phase shifter, and to act on this coupling state depending on this measurement.

4. An accelerator according to claim 1 or 2 wherein at least one of the phase shifters is a quartz phase shifter.

5. An accelerator according to claim 1 or 2 wherein at least one of the phase shifters is a ferrite phase shifter.

6. An accelerator according to claim I or 2 wherein the coupling means comprise a mechanical coupler.

7. An accelerator according to claim 6 wherein the mechanical coupler has two worm screws.

8. An accelerator according to claim 6 wherein the mechanical coupler has two toothed rods.

9. An accelerator according to claim 1 or 2 wherein the coupling means comprise electronic coupling means.

10. An accelerator according to claim 1 or 2 comprising an amplitude discriminator coupled with the fifth signal to perform the setting of the device.

* * * * *